United States Patent
Vandeputte et al.

(12) 
(10) Patent No.: US 6,580,151 B2
(45) Date of Patent: *Jun. 17, 2003

(54) MECHANICAL RESISTANCE OF A SINGLE-CRYSTAL SILICON WAFER

(75) Inventors: Jacques Vandeputte, Charentilly (FR); Florine Bourdet, Tours (FR)

(73) Assignee: STMicroelectronics S.A., Gentilly (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/173,206

(22) Filed: Oct. 15, 1998

(65) Prior Publication Data

US 2002/0050624 A1 May 2, 2002

(30) Foreign Application Priority Data

Oct. 15, 1997 (FR) .............................. 97 13130

(51) Int. Cl.$^7$ .............................................. H01L 29/06
(52) U.S. Cl. ....................................... 257/618; 257/798
(58) Field of Search ................................. 257/618, 798

(56) References Cited

U.S. PATENT DOCUMENTS

| 4,338,481 A | | 7/1982 | Mandelkorn | ................ 136/255 |
|---|---|---|---|---|
| 5,160,560 A | * | 11/1992 | Welkowsky | ................ 156/154 |
| 5,451,804 A | * | 9/1995 | Lur | ............... 257/759 |
| 5,786,988 A | * | 7/1998 | Harari | ........................ 257/618 |

FOREIGN PATENT DOCUMENTS

| DE | A-217 246 | 9/1985 | ............. C23F/1/00 |
|---|---|---|---|
| DE | A-39 00 526 | 7/1989 | ............. G03F/1/00 |
| EP | A-0 137 914 | 4/1985 | ........... H01L/21/32 |

OTHER PUBLICATIONS

French Search Report from French Patent Application 97 13130, filed Oct. 15, 1997.

Patent Abstracts of Japan, vol. 8, No. 191 (M–322), Sep. 4, 1984 & JP–A–59 081057 (Hitachi Seisakusho KK).

Patent Abstracts of Japan, vol. 4, No. 15 (E–170), Feb. 5, 1980 & JP–A–54 156480 (Mitsubishi Electric Corp.).

Patent Abstracts of Japan, vol. 12, No. 425 (E–681), Nov. 10, 1988 & JP–A–63 164273 (Aisin Seiki Co., Ltd.).

* cited by examiner

*Primary Examiner*—Jerome Jackson
(74) *Attorney, Agent, or Firm*—Wolf, Greenfield & Sacks, P.C.; James H. Morris

(57) ABSTRACT

The present invention relates to a method of thinning of a single-crystal silicon wafer so that the wafer has a final thickness lower than 80 $\mu$m.

12 Claims, No Drawings

MECHANICAL RESISTANCE OF A SINGLE-CRYSTAL SILICON WAFER

BACKGROUND OF THE INVENTION

1. Field of the Invention

The present invention relates to the manufacturing of semiconductor components from a single-crystal silicon wafer.

2. Discussion of the Related Art

To manufacture discrete or integrated silicon semiconductor components, wafers are first cut in a single-crystal silicon ingot, in which many identical components are generally formed. The wafers are generally polished to obtain a surface evenness and a parallelism adapted to the subsequent wafer processings.

The polished wafers are then submitted to different doping processes to create semiconductive regions having different doping levels according to the patterns of the components to be made. According to the applications, generally, in the case of integrated circuits, the components are formed from a so-called "front" surface of the wafer and all corresponding metal contacts are on the front surface. For power or high voltage components, the components are formed in the thickness of the silicon wafer from the front and rear surfaces and the wafers then further include one or several contacts on their rear surface.

The different steps (masking, insulator deposition or growth, implantation/diffusion, cleaning, etc.) of manufacturing of semiconductor components require multiple handling of the silicon wafers by batches or individually. However, silicon wafers are very fragile (brittle) and this handling generates very high risks of breakage. Further, the larger the surface, the more fragile the wafer for a given thickness.

To solve this problem of fragility, the wafers are given a minimum thickness which depends on their diameter. The present dimensions of silicon wafers range between 100 mm and 200 mm of diameter and still greater diameters are envisaged. For example, for wafers of 200 mm of diameter in which integrated circuits are to be formed, a thickness on the order of 800 $\mu$m is generally provided.

Most often, the silicon wafer has to be thinned (rectified) by its rear surface before cutting up the integrated circuits and mounting them in packages. Such a rectification can have several aims.

A first aim is to respect the dimensions of packages designed to receive circuits formed in transistors of lower diameter (and thus, of a lower thickness).

A second aim is to reduce or eliminate parasitic implantations/diffusions present at the rear surface and likely to generate operating defects.

Such a rectification at the end of the wafer processing method reduces breakage risks during the first steps of processing of the entire wafers. However, the thinned wafers become extremely fragile for the subsequent steps (metallization, cleaning, chip cutting-up, etc.) and handling that they require. Further, this mechanical fragility is reflected in the implemented integrated circuit chips.

A currently used method to thin the wafers at the end of the integrated circuit manufacturing process includes using a diamond grinding wheel to rectify the rear surface of the wafers and thus decrease their final thickness.

To implement power components, the silicon wafer is doped from both its surfaces. The final thickness of the wafer thus has to be set before the steps of manufacturing of the components. The silicon wafer thus is, in an initial rectification, brought down to the final substrate thickness (generally between 200 $\mu$m and 400 $\mu$m according to the wafer diameter). In this technology, a mechano-chemical polishing method which obtains a better surface evenness than grinding or chemical etch methods (which are other rectification methods) is generally used.

It would be desirable to be able to further decrease the wafer thickness, in particular, to facilitate the implantation/diffusion operations in the wafer thickness. However, such a decrease in thickness is not presently envisaged for reasons of fragility. Indeed, the wafer thickness limit is presently set by the minimum acceptable mechanical resistance criterion not to have too many losses due to handling. With the present thicknesses included between 200 $\mu$m and 400 $\mu$m, the wafers are already extremely brittle with respect to wafers used to form integrated circuits.

SUMMARY OF THE INVENTION

An object of the present invention is to provide a novel silicon wafer which is less fragile than present wafers and which, in particular, is less brittle.

Another object of the present invention is to provide such a silicon wafer having a substantially constant thickness.

Another object of the present invention is to provide a silicon wafer that improves the mechanical resistance of integrated circuits made from this wafer.

A characteristic of the present invention is to provide a thinning of a silicon wafer down to a thickness lower than approximately 80 $\mu$m.

While the fragility of a wafer of low thickness in the state of the art results in increasing its thickness, the present invention provides, conversely, to decrease the wafer thickness. Indeed, the applicant has found that by passing under a thickness threshold on the order of 80 $\mu$m, the silicon wafer is no longer brittle. It becomes flexible.

Referring to other materials, it could be thought that the fragility remains, for silicon, associated with the thickness. Indeed, silicon oxide (SiO2) which is currently used in extremely low thicknesses (from a few hundred angstroms to a few $\mu$m) remains very brittle. To make silicon oxide less brittle, it is necessary to incorporate additives therein to produce glasses which, at given thicknesses and according to the additives used, can become less brittle. However, such additions are not easily compatible with the use of silicon in the field of semiconductors.

Thus, with respect to the state of the art, the present invention has at least three surprising effects.

A first surprising effect is that a wafer of a thickness lower than 80 $\mu$m bends rather than break when undergoing mechanical stress.

A second surprising effect is that the wafer recovers its initial planar shape as soon as the mechanical stress disappears and bears no mark of the performed deflection.

A third surprising effect is that the wafer flexibility is accompanied by no alteration of the single-crystal silicon forming it as concerns its function as a semiconductor material.

Further, these features are independent from the crystal plane in which the silicon ingot from which the wafer is obtained is formed.

Another object of the present invention is to provide a method of thinning of a silicon wafer which is particularly adapted to obtaining silicon wafers of very low and substantially constant thickness.

To achieve this object, a characteristic of the present invention is to provide a step of mechano-chemical polishing in which the holding of the wafer against its bearing is only performed by a molecular vacuum between the wafer and its bearing.

More specifically, the present invention provides a single-crystal silicon wafer having a thickness lower than 80 µm.

According to an advantage of the present invention, the silicon wafer is flexible and deflection-resilient.

According to an embodiment of the present invention, the silicon wafer has a given thickness ranging between 25 and 60 µm.

According to an embodiment of the present invention, the silicon wafer forms a substrate for manufacturing semiconductor power components.

According to an embodiment of the present invention, the silicon wafer comprises, on a front surface, elements defining an integrated circuit.

The present invention also provides a method of thinning of a single-crystal silicon comprising thinning the wafer until a thickness lower than 80 µm is obtained.

According to an embodiment of the present invention, this method comprises performing a rectification by mechano-chemical polishing of at least one first surface of the silicon wafer and of hanging the wafer to a holding device meant to be driven in an epicycloidal rotating motion with respect to a polishing felt, only by creating a molecular vacuum between the second surface of the wafer and a planar bearing of the holding device.

According to an embodiment of the present invention, the method comprises performing a chemical etch of at least one first surface of the wafer, before performing the mechano-chemical polishing.

The present invention also provides a semiconductor power component comprising a silicon substrate of a thickness lower than 80 µm.

The present invention also provides an integrated circuit chip of a thickness lower than 80 µm.

The present invention also provides a silicon wafer having a thickness of less than about 80 microns and a thickness variation less than ±10 microns.

The present invention also provides a single-crystal wafer having a thickness of less than about 80 microns, and surfaces of the silicon wafer being free of overlying layers. Within this disclosure, the term "overlying layer" is meant to refer to any layer that is deposited or grown on the surface of the wafer for processing such as epitaxial silicon layers, silicon oxide layers, metal layers, and others.

The present invention also provides a silicon wafer having surfaces free of overlying layers and a thickness variation of less than ±10 microns, and the silicon wafer being substantially planar in an unstressed condition and bendable to a non-planar shape in response to a mechanical stress.

The present invention also provides a semiconductor device having a thickness of less than about 80 microns.

The present invention also provides a method for making a single crystal silicon wafer including the step of thinning the silicon wafer having surfaces free of overlying layers to a thickness of less than about 80 microns.

The present invention also provides a method of making a semiconductor device including the step of forming an overlying layer on a silicon substrate, when the silicon substrate has a thickness of less than about 80 microns.

The patent application DD-A-217 246 discloses a silicon wafer that can have a thickness lower than 50 µm for X-rays analysis. This document teaches away from any manufacturing by polishing and indicates that the used manufacturing method leads to thickness variations of ±10 µm. This means that a wafer having a nominal thickness of 50 µm will in some places have a thickness of 40 µm and at other places a thickness of 60 µm. So, the wafer is inadequate for constituting a semiconductor component substrate.

By contrast, an advantage of the polishing method according to the invention is that it provides wafers having a substantially constant thickness.

The foregoing objects, features and advantages of the present invention, will be discussed in detail in the following non-limiting description of specific embodiments.

DETAILED DESCRIPTION

The thinning method which will be described hereafter is a solution particularly adapted to obtaining very thin silicon wafers.

This method implements a mechano-chemical polishing step using conventional equipment, for example, using a device known under trademark "MECAPOL 660E".

Such a device is generally formed of a plate of relatively large dimension and at the upper surface of which is glued a polishing felt. A silicon wafer to be polished is placed in a wafer-boat meant to be hung above the plate, so that the wafer surface to be polished can bear against the polishing felt. The wafer is hung to a bearing, itself pasted to a holding disk mounted in the wafer-boat. The disk is generally held by suction in the wafer boat.

In the polishing operation, the plate is rotated. The wafer boat, hung to a drive mechanism via a pivotable arm, is rotated in an epicycloidal and alternative crosswise sweep motion, and is lowered so that the wafer is in contact with the felt.

The bearing is generally in a material chosen so that the wafer is, in the absence of lateral motion, maintained against the bearing by superficial tension of its surface opposite to the surface to be polished. Indeed, the surface evenness, in particular when this surface has already been polished, enables the wafer to vertically adhere to the bearing, surface against surface. However, it is known that a properly polished surface adheres against another planar surface, but that both surfaces can slide with respect to each other.

Thus, conventional mechano-chemical polishing equipment generally includes a peripheral frame pasted on the bearing, or possibly on the disk. This frame has a height sufficient to extend beyond the bearing, to laterally maintain the wafer.

To enable the thinning of a silicon wafer until a thickness lower than 80 µm is obtained, the equipment used, according to the present invention, has no lateral wafer hold frame. This absence of use of a lateral hold frame eliminates any thickness margin with respect to the wafer surface opposite to the surface to be polished and, accordingly, to perform a mechano-chemical polishing to obtain a very low thickness.

The bearing hold disk is chosen to be rigid and to have the most planar possible surface on the bearing side. For example, a stainless disk can be used or, for its lightness, an aluminum disk, both materials being adapted to obtaining planar surfaces.

According to the present invention, the bearing is chosen to have the following characteristics.

First, this bearing has a sufficient suppleness to absorb surface evenness tolerances of the rigid disk and of the surface of the wafer opposite to the surface to be polished.

In particular, if the wafer has to be polished on both its surfaces, the surface which is hidden during the polishing of a first surface does not exhibit a perfect surface evenness.

Further, in the case of a polishing used to lower the final thickness of a silicon wafer after implanting integrated circuits, the front surface of the wafer which is not to be rectified is not perfectly planar due to steps of manufacturing of the circuits.

Further, at least at the beginning of the polishing, the wafer has a thickness in which it is very brittle. As a result, the slightest speck of dust or the slightest defect between the bearing and the wafer risks causing, during polishing, breakage of the wafer. The bearing thus has to be able to form, by its suppleness, a pad for the wafer.

The bearing is further chosen to be perfectly planar to respect the parallelism between both wafer surfaces. For the bearing suppleness to not adversely affect the parallelism of the two wafer surfaces, the bearing is, preferably, thin (for example, of a thickness lower than 5 mm).

Preferably, the bearing will be chosen to have a compressibility included between 5 and 20% and a thickness lower than 2 mm.

According to an embodiment of the present invention, the bearing is formed of a microporous material associated, on a surface, with a vulcanizable cell to enable its attachment to the disk. The material must be such that its surface does not harden after vulcanization. For example, a material known under trademark "NEWMAN, Pb100-AD8" which has a thickness of 1.5 mm can be used.

According to another preferred embodiment of the present invention, the bearing is made of porous polyester/polyurethane, sized at low temperature on the disk via a thin adhesive film. For example, a material known under trademark "RODEL WB20" which has a general thickness, that is, including the adhesive film, on the order of 0.5 mm, or even lower can be used.

An example of a material which has not been retained to form the bearing, a material known under trademark "RODEL DF200" which, in the context of the present invention, is not sufficiently porous to enable adhesion of the wafer to prevent its lateral motion during polishing.

The implementation of the thinning method according to the present invention is performed as follows.

The wafer is preferably first submitted to a chemical etch step, for example of its rear surface, to decrease its thickness. Then, the wafer is submitted to a mechano-chemical polishing of at least its rear surface. The wafer thickness at the end of the chemical etch corresponds, preferably, to the final thickness desired, plus at least 25 $\mu$m per surface to be polished.

An advantage of using a chemical etch between a possible rectification by grinding and the mechano-chemical polishing is that the etching can be performed by batches of some hundred wafers, whereas the polishing is performed wafer per wafer or by groups of 2 or 3 wafers. Since the durations required for a given thickness reduction are substantially of the same order of magnitude, the processing time per wafer is reduced. Further, the breakage risks associated with heating during the polishing are thus avoided, and the number of wafers which can be polished by the same felt is increased by limiting its loading.

When the microporous bearing is new, it is wet before positioning a silicon wafer to be processed in order to improve the adhesion of the wafer against the bearing. Further, this bearing associated with the disk is preferably pressed with a silicon wafer of same diameter as the wafers to be polished, to form an impression of very low depth in the bearing. Such an impression optimizes the lateral hold of the wafers to be polished which will then be placed against the bearing.

The preparation of a new bearing comprises sizing a microporous bearing on the device disk. For example, if a material sized at low temperature for the bearing, the bearing is applied by its sticking surface on the planar surface of the disk, then the assembly is pressed to suppress all air microbubbles likely to be present between the bearing and the disk. Here, another advantage of using a microporous material for the bearing becomes apparent. The free surface of the bearing is, during this press step, preferably, protected by a cleanliness sheet to avoid the inclusion of dust in the subsequent bonding surface of the wafers.

The placing of a wafer is performed by laying the wafer surface, opposite to the surface to be polished, against the free surface of the bearing. By applying a slight regular pressure on the wafer, a molecular vacuum enabling the adhesion of the wafer, against the bearing is created between the wafer and the bearing due to the use of a microporous material. Of course, attention will be paid not to apply too high a pressure, due to the fragility of the silicon wafer which is, at least before the processing, very brittle.

The assembly is then mounted in the wafer boat. Then, the mechano-chemical polishing of the surface is performed conventionally by providing, via a dispenser, a polishing solution, for example, a liquid colloidal silica and potash (KOH) solution.

The final thickness of the wafer is directly associated with the duration of the mechano-chemical polishing. According to the present invention, the mechano-chemical polishing is, preferably, performed until the wafer thickness becomes lower than 80 $\mu$m and, preferably, is included between 25 and 60 $\mu$m.

If the lowering of the wafer thickness is performed after implanting the electronic components in the silicon, the rectification is performed on a single surface (the surface opposite to the components). Conversely, the thinning of a silicon wafer before implantation of components is performed on both surfaces, in particular, to implement power components. In this case, a first surface of the wafer is first rectified, then the wafer is turned over to rectify its second surface until the desired final thickness is obtained. A rectification by polishing of the two wafer surfaces improves, for a final thickness lower than 80 $\mu$m, the deflection capacity of the obtained wafer with respect to a rectification on a single surface.

To release a wafer at the end of a polishing cycle, a Nylon thread which is slid between the wafer and the bearing can for example be used. Preferably, a sheet, for example a non plushy paper sheet, of low thickness (for example, on the order of 80 $\mu$m) which has the advantage, in particular if the wafer has to be removed before having reached a thickness making it flexible, to reduce or minimize the risks of a peripheral nick of the wafer, is used. In the case where the adhesion is such that the resistance to delamination does not enable removal the wafer by means of a paper sheet, the bearing and the wafer are showered, for example with water, which makes the delamination easier by reintroducing water in the bearing pores.

The use of a silicon wafer of very low thickness according to the present invention has many advantages.

A first advantage is that the wafer obtained is flexible. This advantage has many favorable consequences for the manufacturing of semiconductor components. First, this flexibility makes the wafer less fragile, in particular, less brittle than a conventional wafer. Thus, breaking risks upon handling of the wafers between the different processing stations used to manufacture the semiconductor components, be they discrete or integrated, are minimized.

The wafer flexibility increases with the decrease of its thickness. For example, a wafer of a diameter of 125 mm and of a thickness of 50 $\mu$m according to the present invention can be seized, by its edges, between two fingers and bent until it forms a U having substantially parallel branches. With a wafer of same diameter but of a thickness of 25 $\mu$m, a similar manipulation leads to having the two opposite edges touch.

The wafer flexibility results in a suppleness of the implemented components, in particular, of the once cut-up integrated circuit chips. Now, the different levels of metallization added on a very thin silicon wafer according to the present invention appear to preserve the flexibility of the implemented circuit. To make a supple chip, the silicon oxide, generally used as an insulator between the different levels of metallization, can be replaced by a more supple material, for example, an organic resin (for example, a polyamide-imide).

An advantage of then having an integrated circuit which not only is supple, but also has a resilience which enables it to recover all its structural and electric characteristics, is that integrated circuit chips then become much less fragile. An example of application where the present invention is particularly advantageous relates to the field of so-called "chip" cards, "credit" cards, or "pre-pay" cards, in which an integrated circuit chip is included in a thin plastic card. In such an application, the insertion of the chips in cards is facilitated, with the card being able to remain supple, and the card lifetime is improved since the risks of destroying the chip due to handling the user is reduced or eliminated.

Another advantage of the present invention is that, with a very thin wafer, meant for example to form the substrate of a power component, it is easier and faster to obtain a homogeneous doping level. Further, and obviously, the manufacturing of insulating walls meant to form, in the substrate, insulated wells, is much simplified and accelerated.

Another advantage, in particular for the implementation of MOS power transistors in the thickness of an N-type substrate, is that the on-state drain-source resistance of the implemented transistors is reduced or minimized.

Of course, the present invention is likely to have various alterations, modifications, and improvements which will readily occur to those skilled in the art. In particular, although the mechano-chemical polishing method described hereabove forms a preferred means of obtaining silicon wafers of extremely low thickness according to the present invention, other thinning methods may be used. Further, the final thickness of the silicon wafer will be chosen, in particular, according to the flexibility desired for it and/or to the thickness in which it is desired to make power components.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A single-crystal silicon wafer having a diameter of greater than about 100 millimeters, a thickness of less than about 80 microns and a thickness variation of less than ±10 microns, surfaces of the silicon wafer being free of contact with other materials.

2. The silicon wafer of claim 1 wherein the silicon wafer is substantially planar in an unstressed condition, the silicon wafer being bendable to a non-planar shape in response to a mechanical stress.

3. The silicon wafer of claim 2 wherein the silicon wafer is bendable to form a U-shape having a first section of a wafer surface that is substantially parallel to a second section of the wafer surface.

4. The silicon wafer of claim 2 wherein the silicon wafer is capable of being flexed so that a first edge of the silicon wafer contacts an opposite edge of the silicon wafer.

5. The silicon wafer of claim 2 wherein the silicon wafer returns to a substantially planar shape in response to the removal of the mechanical stress.

6. The silicon wafer of claim 2 wherein the silicon wafer comprises substantially single-crystal silicon after being bent.

7. The silicon wafer of claim 1 wherein the thickness is between 25 microns and 60 microns.

8. The silicon wafer of claim 1, wherein the thickness of the silicon wafer is substantially constant.

9. The silicon wafer of claim 1, wherein the single-crystal silicon wafer includes a doped region.

10. The silicon wafer of claim 9, wherein the doped region extends from a front surface of the silicon wafer.

11. The silicon wafer of claim 9, wherein the doped region extends from a rear surface of the silicon wafer.

12. The silicon wafer of claim 9, wherein the doped region comprises an insulating wall.

* * * * *